United States Patent
Bez et al.

(10) Patent No.: US 7,993,957 B2
(45) Date of Patent: Aug. 9, 2011

(54) PHASE CHANGE MEMORY CELL AND MANUFACTURING METHOD THEREOF USING MINITRENCHES

(75) Inventors: Roberto Bez, Milan (IT); Fabio Pellizzer, Follina (IT); Marina Tosi, Trezzo Sull'Adda (IT); Romina Zonca, Paullo (IT)

(73) Assignee: Micron Technology, Inc., Boise, ID (US)

( * ) Notice: Subject to any disclaimer, the term of this patent is extended or adjusted under 35 U.S.C. 154(b) by 934 days.

(21) Appl. No.: 11/045,170

(22) Filed: Jan. 27, 2005

(65) Prior Publication Data
US 2005/0152208 A1 Jul. 14, 2005

Related U.S. Application Data

(60) Division of application No. 10/372,761, filed on Feb. 20, 2003, now Pat. No. 6,891,747, which is a continuation-in-part of application No. 10/313,991, filed on Dec. 5, 2002.

(30) Foreign Application Priority Data

Feb. 20, 2002 (EP) .................................... 02425087

(51) Int. Cl.
*H01L 21/00* (2006.01)
(52) U.S. Cl. .............. 438/98; 438/128; 438/130; 257/4; 430/314
(58) Field of Classification Search .................. None
See application file for complete search history.

(56) References Cited

U.S. PATENT DOCUMENTS

| | | | | |
|---|---|---|---|---|
| 5,789,277 A | | 8/1998 | Zahorik et al. ................... 438/95 |
| 5,814,527 A | * | 9/1998 | Wolstenholme et al. ......... 438/5 |
| 5,952,671 A | | 9/1999 | Reinberg et al. ................... 257/3 |
| 5,970,336 A | | 10/1999 | Wolstenholme et al. ...... 438/238 |
| 6,031,287 A | * | 2/2000 | Harshfield ..................... 257/734 |
| 6,238,946 B1 | | 5/2001 | Ziegler ............................ 438/50 |
| 6,313,604 B1 | | 11/2001 | Chen ............................... 438/95 |
| 6,316,784 B1 | | 11/2001 | Zahorik et al. ..................... 257/3 |

(Continued)

FOREIGN PATENT DOCUMENTS

EP 0 477 938 A2 4/1992

(Continued)

OTHER PUBLICATIONS

U.S. Appl. No. 09/276,273, filed Mar. 25, 1999, Klersy.

(Continued)

*Primary Examiner* — Steven Loke
*Assistant Examiner* — David Goodwin
(74) *Attorney, Agent, or Firm* — Blakely, Sokoloff, Taylor & Zafman LLP

(57) ABSTRACT

A process forms a phase change memory cell using a resistive element and a memory region of a phase change material. The resistive element has a first thin portion having a first sublithographic dimension in a first direction; and the memory region has a second thin portion having a second sublithographic dimension in a second direction transverse to the first dimension. The first thin portion and the second thin portion are in direct electrical contact and define a contact area of sublithographic extension. The second thin portion is delimited laterally by oxide spacer portions surrounded by a mold layer which defines a lithographic opening. The spacer portions are formed after forming the lithographic opening, by a spacer formation technique.

14 Claims, 12 Drawing Sheets

U.S. PATENT DOCUMENTS

| | | | |
|---|---|---|---|
| 6,440,837 B1 | 8/2002 | Harshfield | 438/618 |
| 6,512,241 B1* | 1/2003 | Lai | 257/4 |
| 6,541,333 B2 | 4/2003 | Shukuri et al. | 438/243 |
| 6,545,287 B2 | 4/2003 | Chiang | 257/3 |
| 6,586,761 B2 | 7/2003 | Lowrey | 257/3 |
| 6,589,714 B2* | 7/2003 | Maimon et al. | 430/313 |
| 6,613,604 B2* | 9/2003 | Maimon et al. | 438/95 |
| 6,617,192 B1 | 9/2003 | Lowrey et al. | 438/95 |
| 6,733,956 B2* | 5/2004 | Maimon et al. | 430/314 |
| 6,750,079 B2 | 6/2004 | Lowrey et al. | 438/95 |
| 6,764,894 B2* | 7/2004 | Lowrey | 438/238 |
| 6,774,387 B2 | 8/2004 | Maimon | |
| 6,777,260 B1* | 8/2004 | Chen | 438/95 |
| 6,943,365 B2 | 9/2005 | Lowrey | 257/3 |
| 6,969,866 B1 | 11/2005 | Lowrey et al. | 257/3 |
| 6,995,388 B2* | 2/2006 | Hwang et al. | 257/4 |
| 2001/0002046 A1 | 5/2001 | Reinberg et al. | 257/3 |
| 2002/0017701 A1 | 2/2002 | Klersy et al. | 257/536 |
| 2002/0036931 A1* | 3/2002 | Lowrey et al. | 365/200 |
| 2002/0070401 A1 | 6/2002 | Takeuchi et al. | 257/296 |
| 2003/0075778 A1 | 4/2003 | Klersy | 257/536 |
| 2003/0219924 A1 | 11/2003 | Bez et al. | 438/102 |
| 2003/0231530 A1 | 12/2003 | Bez et al. | 365/200 |
| 2004/0011381 A1 | 1/2004 | Klebanoff et al. | 134/2 |
| 2004/0012009 A1 | 1/2004 | Casagrande et al. | 257/4 |
| 2004/0113136 A1* | 6/2004 | Dennison | 257/2 |
| 2004/0166604 A1 | 8/2004 | Ha et al. | 438/102 |
| 2004/0211953 A1* | 10/2004 | Khouri et al. | 257/2 |
| 2004/0245603 A1 | 12/2004 | Lowrey et al. | 257/536 |
| 2006/0110888 A1* | 5/2006 | Cho et al. | 438/385 |

FOREIGN PATENT DOCUMENTS

| | | |
|---|---|---|
| EP | 01 83 0039 | 6/2001 |
| EP | 1 227 499 A1 | 7/2002 |
| WO | WO 00/57498 | 9/2000 |

OTHER PUBLICATIONS

Palun, L., et al., "Fabrication of Single Electron Devices by Hybrid (E-Beam/DUV) Lithography," *Microelectronic Engineering* 53:167-170, 2000.

* cited by examiner

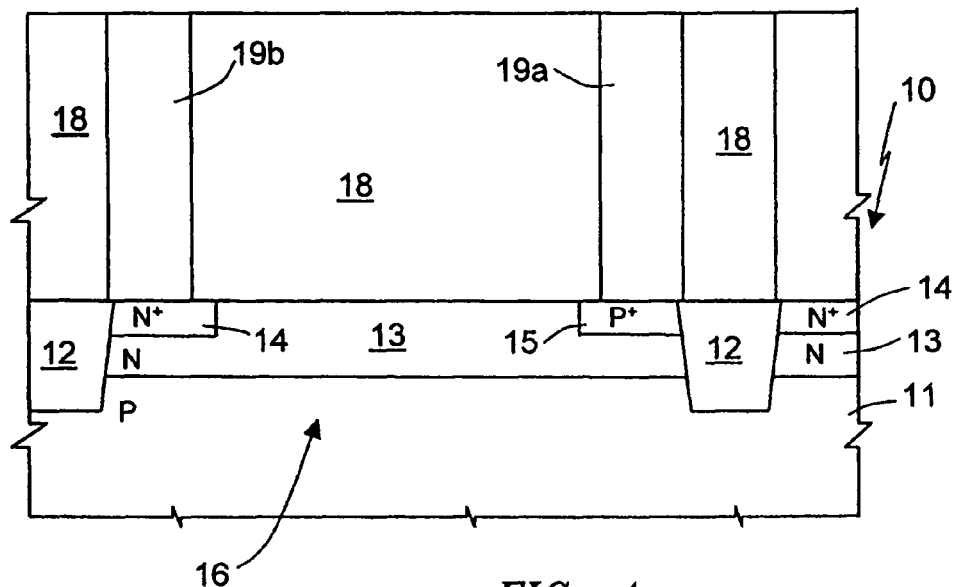
FIG. 4
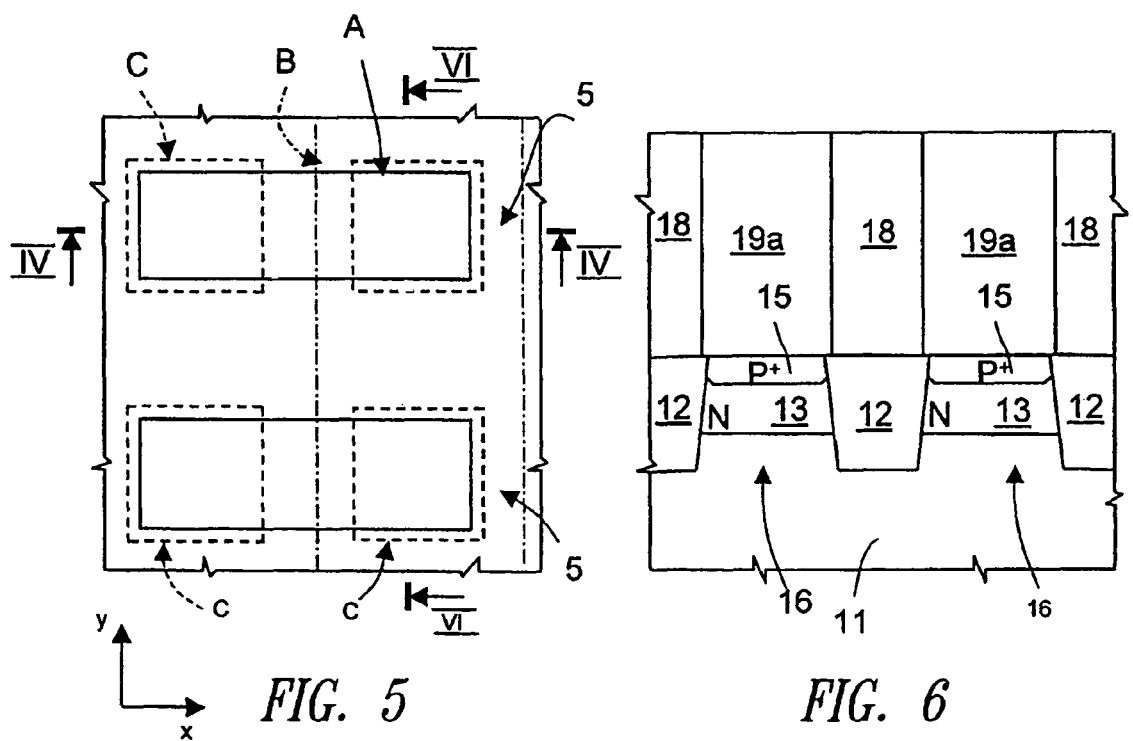
FIG. 5
FIG. 6

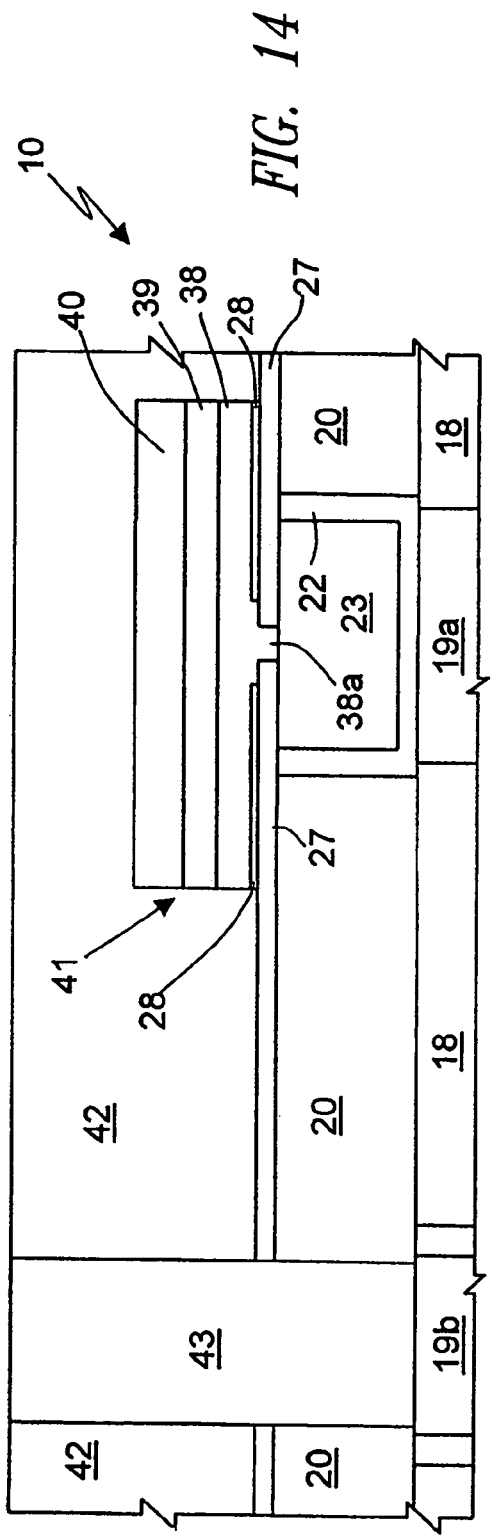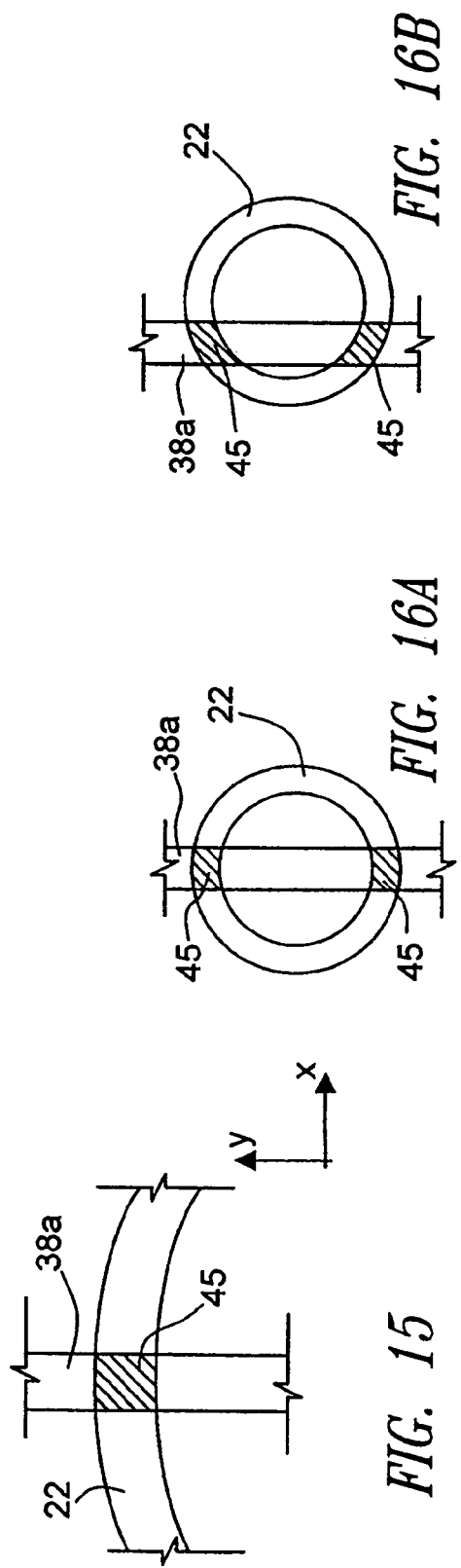

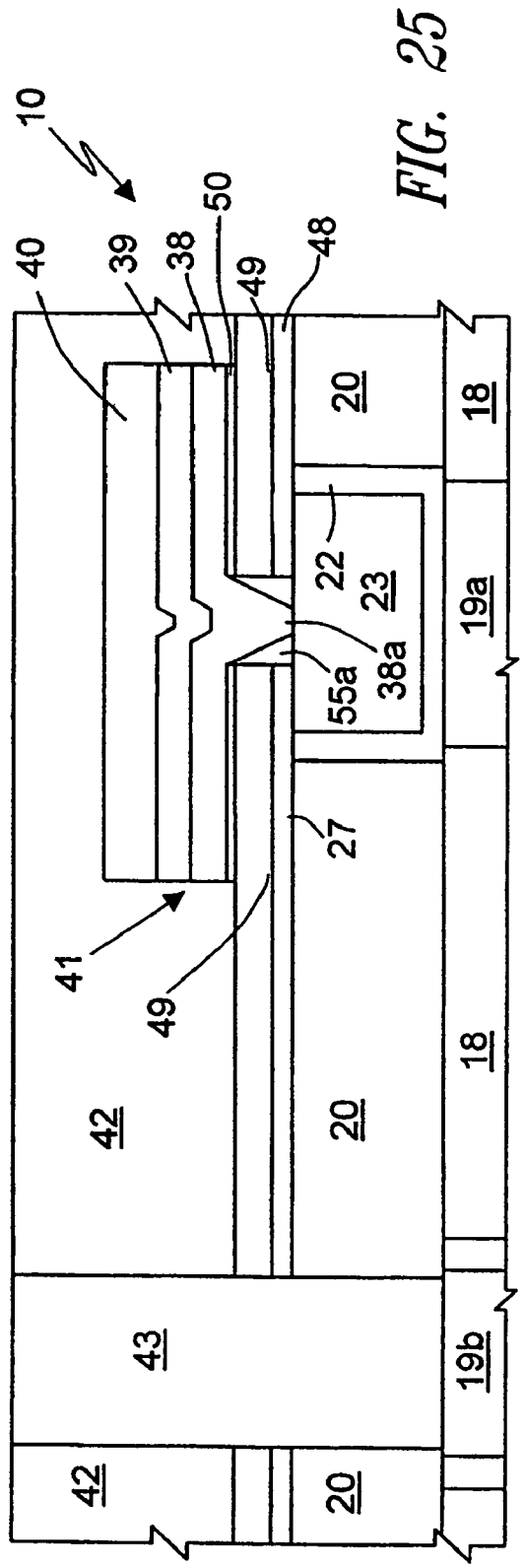
FIG. 25
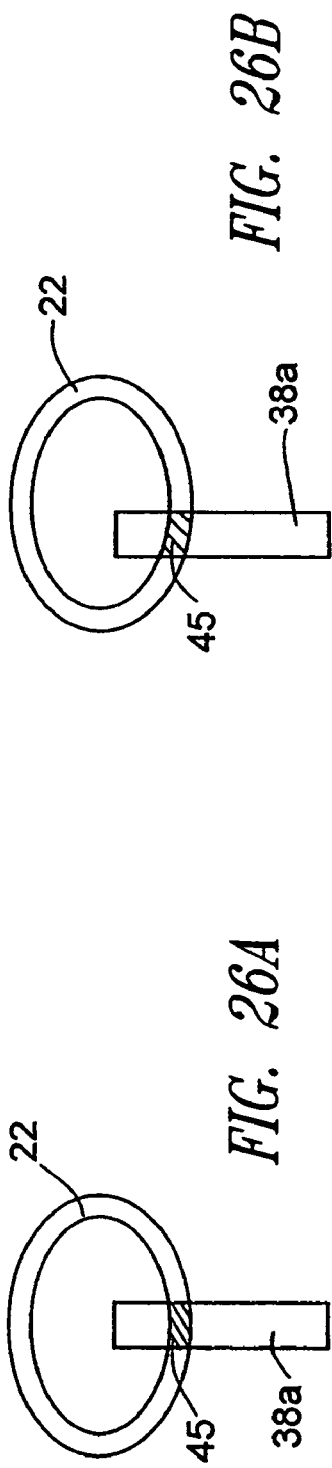
FIG. 26A
FIG. 26B

PHASE CHANGE MEMORY CELL AND MANUFACTURING METHOD THEREOF USING MINITRENCHES

BACKGROUND OF THE INVENTION

1. Field of the Invention

The present invention relates to a phase change memory cell and to a manufacturing process thereof.

2. Description of the Related Art

As is known, phase change memory (PCM) elements exploit the characteristics of materials which have the property of changing between two phases having distinct electrical characteristics. For example, these materials may change from an amorphous phase, which is disorderly, to a crystalline or polycrystalline phase, which is orderly, and the two phases are associated to considerably different resistivity.

At present, alloys of group VI of the periodic table, such as Te or Se, referred to as chalcogenides or chalcogenic materials, can advantageously be used in phase change cells. The chalcogenide that currently offers the most promise is formed by a Ge, Sb and Te alloy ($Ge_2Sb_2Te_5$), which is currently widely used for storing information in overwritable disks.

In chalcogenides, the resistivity varies by two or more magnitude orders when the material passes from the amorphous phase (more resistive) to the polycrystalline phase (more conductive) and vice versa. The characteristics of chalcogenides in the two phases are shown in FIG. 1. As may be noted, at a given read voltage, here designated by Vr, there is a resistance variation of more than 10.

Phase change may be obtained by locally increasing the temperature, as shown in FIG. 2. Below 150° C. both phases are stable. Above 200° C. (temperature of start of nucleation, designated by $T_x$), fast nucleation of the crystallites takes place, and, if the material is kept at the crystallization temperature for a sufficient length of time (time $t_2$), it changes its phase and becomes crystalline. To bring the chalcogenide back into the amorphous state, it is necessary to raise the temperature above the melting temperature $T_m$ (approximately 600° C.) and then to cool the chalcogenide off rapidly (time $t_1$).

From the electrical standpoint, it is possible to reach both critical temperatures, namely the crystallization temperature and the melting point, by causing a current to flow through a resistive element which heats the chalcogenic material by the Joule effect.

The basic structure of a PCM element 1 which operates according to the principles described above is shown in FIG. 3 and comprises a resistive element 2 (heater) and a programmable element 3. The programmable element 3 is made of a chalcogenide and is normally in the polycrystalline state in order to enable a good flow of current. One part of the programmable element 3 is in direct contact with the resistive element 2 and forms the area affected by phase change, hereinafter referred to as the phase change portion 4.

If an electric current having an appropriate value is caused to pass through the resistive element 2, it is possible to heat the phase change portion 4 selectively up to the crystallization temperature or to the melting temperature and to cause phase change. In particular, if a current I flows through a resistive element 2 having resistance R, the heat generated is equal to $I^2R$.

The use of the PCM element of FIG. 3 for forming memory cells has already been proposed. In order to prevent noise caused by adjacent memory cells, the PCM element is generally associated to a selection element, such a MOS transistor, a bipolar transistor, or a diode.

All the known approaches are, however, disadvantageous due to the difficulty in finding solutions that meet present requirements as regards capacity for withstanding the operating currents and voltages, as well as functionality and compatibility with present CMOS technologies.

In particular, considerations of a technological and electrical nature impose the creation of a contact area of small dimensions, preferably 20 nm×20 nm, between the chalcogenic region and a resistive element. However, these dimensions are much smaller than those that can be obtained with current optical (UV) lithographic techniques, which scarcely reach 100 linear nm.

BRIEF SUMMARY OF THE INVENTION

An embodiment of the present invention provides a phase change memory cell that includes a resistive element, including a first thin portion having a first sublithographic dimension in a first direction, and a memory region of a phase change material and including a second thin portion having a second sublithographic dimension in a second direction transverse to the first direction. The resistive element and the memory region are in direct electrical contact at the first and second thin portions and define a contact area of sublithographic extension. The second thin portion is delimited laterally in the second direction by spacer portions of a first dielectric material, thereby defining inclined surfaces in a third direction, transverse to said first and second directions.

Another embodiment of the invention provides a process for manufacturing a phase change memory cell. The process includes forming a resistive element including a first thin portion having a first sublithographic dimension in a first direction; and forming a memory region of a phase change material and including a second thin portion having a second sublithographic dimension in a second direction transverse to the first direction. The first and second thin portions define a contact area of sublithographic extension. Forming a memory region includes forming a mold layer on top of the resistive element, forming a first lithographic opening in the mold layer, forming spacer portions in the first lithographic opening, the spacer portions defining a slit having the second sublithographic dimension; and depositing a phase change layer inside the slit.

BRIEF DESCRIPTION OF THE DRAWINGS

For a better understanding of the present invention, a preferred embodiment thereof is now described, purely by way of non-limiting example, with reference to the attached drawings, in which:

FIG. 4 shows a cross section of a wafer of semiconductor material in a manufacturing step of the cell of FIG. 3, according to the parent patent application;

FIG. 5 shows the layout of some masks used for forming the structure of FIG. 4;

FIG. 6 is a cross-section taken along line VI-VI of FIG. 5;

FIGS. 7-14 are cross-section of the structure of the above mentioned patent application, in successive manufacture steps;

FIG. 15 is a top plan view, with parts removed and at an enlarged scale, of a detail of FIG. 4;

FIGS. 16a and 16b are top plan views, with parts removed, of a detail of FIG. 14, in two different manufacture conditions;

FIG. 25 is a cross-section, similar to FIG. 14, in a final manufacture step according to an embodiment of the invention;

FIGS. 26a and 26b are top plan views of the contact area, in two different manufacture conditions.

DETAILED DESCRIPTION OF THE INVENTION

Figure 1:
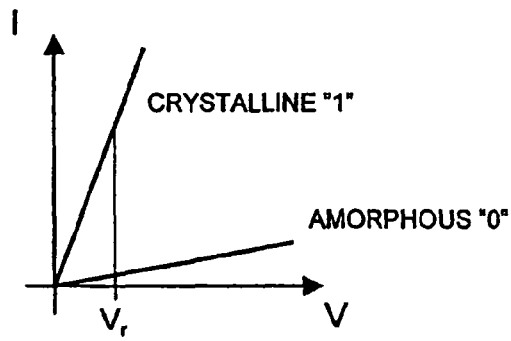
FIG. 1 shows the current versus voltage characteristic of a phase change material.
Figure 2:
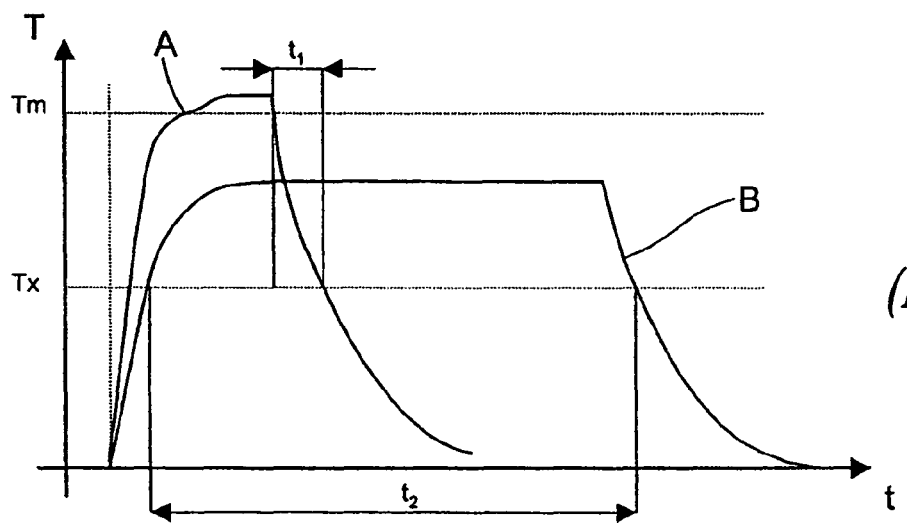
FIG. 2 shows the temperature versus current plot of a phase change material.

The parent application teaches forming the contact area as an intersection of two thin portions extending transversely with respect to one another and each of a sublithographic size. In order to form the thin portions, deposition of layers is adopted instead of a lithographic process, given that deposition makes it possible to obtain very thin layers, i.e., having a thickness much smaller than the current minimum size that can be achieved using lithographic techniques.

For a better understanding of embodiments of the present invention, the manufacturing process of the parent patent application will now be described.

With reference to FIG. 4, initially a wafer 10 comprising a P-type substrate 11 is subjected to standard front end steps. In particular, inside the substrate 11 insulation regions 12 are formed and delimit active areas 16; then, in succession, N-type base regions 13, N$^+$-type base contact regions 14, and P$^+$-type emitter regions 15 are implanted. The base regions 13, base contact regions 14, and emitter regions 15 form diodes that form selection elements for the memory cells.

Next, a first dielectric layer 18 is deposited and planarized; openings are formed in the first dielectric layer 18 above the base contact regions 13 and emitter regions 15, and the openings are filled with tungsten to form base contacts 19b and emitter contacts 19a. The base contacts 19b are thus in direct electrical contact with the base contact regions 13, and the emitter contacts 19a are in direct electrical contact with the emitter regions 15. Advantageously, the openings in the first dielectric layer 18 can be covered by a barrier layer, for example a Ti/TiN layer, before being filled with tungsten. In this way, the structure of FIG. 4 is obtained.

FIG. 5 shows the layout of some masks used for forming the structure of FIG. 4 regarding a pair of memory cells 5 that are adjacent in a perpendicular direction to the sectional plane of FIG. 4 (Y direction). In particular, the figure shows a mask A used for defining the active areas 16, a mask B used for implanting the emitter regions 15, and a mask C for forming the openings where the base contacts 19b and the emitter contacts 19a are to be formed. FIG. 4 is a cross-section taken along line IV-IV of FIG. 5, while FIG. 6 shows the same structure sectioned along the section line VI-VI of FIG. 5.

Figure 3:
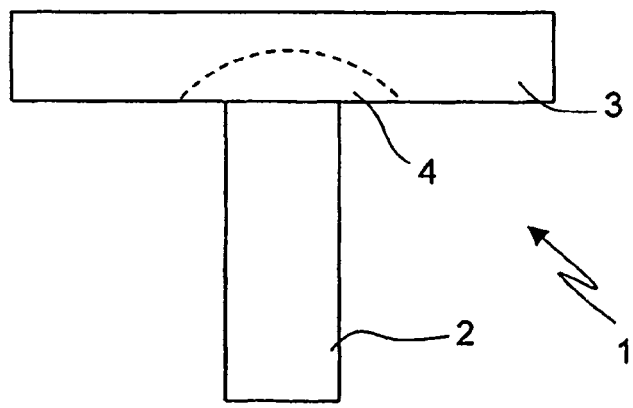
FIG. 3 shows the basic structure of a PCM memory element.

Next (FIG. 7), a second dielectric layer 20—for example, an undoped silicon glass (USG) layer—is deposited, and openings 21 are formed in the second dielectric layer 20 above the emitter contact 19a. The openings 21 have dimensions dictated by the lithographic process and are, for example, circle-shaped. Next, a heating layer, for example of TiSiN, TiAlN or TiSiC, is deposited for a thickness of 10-50 nm, preferably 20 nm. The heating layer, designed to form the resistive element 2 of FIG. 3, conformally coats the walls and bottom of the openings 21 and is subsequently removed outside the openings 21. The remaining portions of the heating layer thus form a cup-shaped region 22 and are then filled with dielectric material 23.

Figure 8:
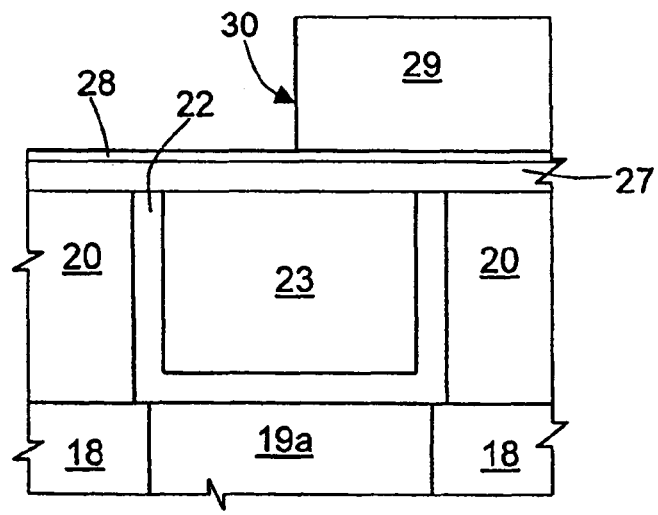

Next, as shown in the enlarged detail of FIG. 8, a mold layer 27, for instance USG having a thickness of 20 nm, an adhesion layer 28, for instance Ti or Si with a thickness of 5 nm, and a first delimiting layer 29, for example nitride or another material that enables selective etching with respect to the adhesion layer 28, are deposited in sequence. The first delimiting layer 29 has a thickness of, for instance, 150 nm. Then, using a mask, one part of the first delimiting layer 29 is removed by dry etching to form a step which has a vertical side 30 that extends vertically on top of the dielectric material 23. The structure shown in FIG. 8 is thus obtained.

Figure 9:
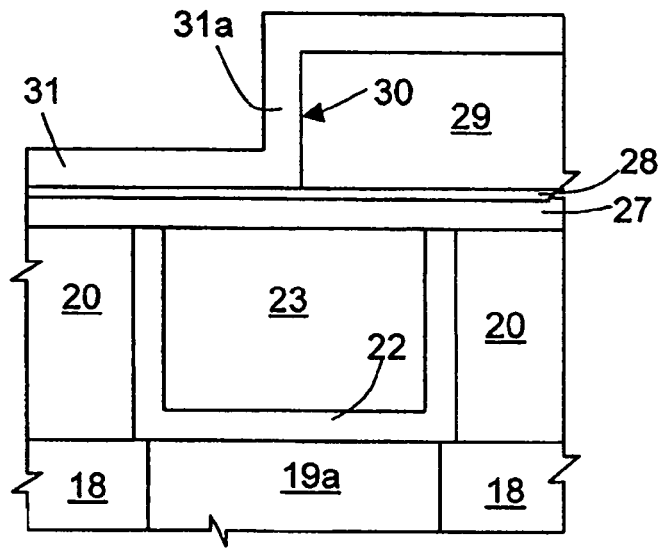

Next (FIG. 9), a sacrificial layer 31, for example TiN with a thickness of 30 nm, is deposited conformally. In particular, the sacrificial layer forms a vertical wall 31a that extends along the vertical side 30 of the first delimiting layer 29.

Figure 10:
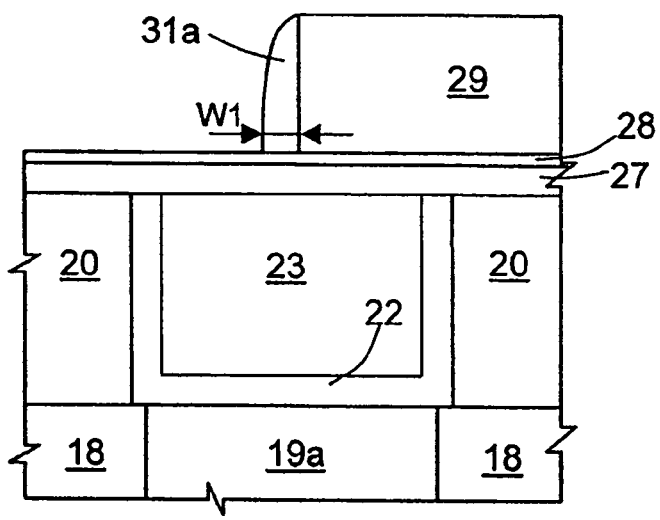

Next (FIG. 10), the sacrificial layer 31 is undergoes an etch back that results in removal of the horizontal portions of the sacrificial layer 31 and of part of the vertical wall 31a. By appropriately choosing the thickness of the first delimiting layer 29 and the thickness of the sacrificial layer 31, as well as the time and type of etching, it is possible to obtain the desired sublithographic width W1 for the bottom part of the remaining vertical wall 31a.

Figure 11:
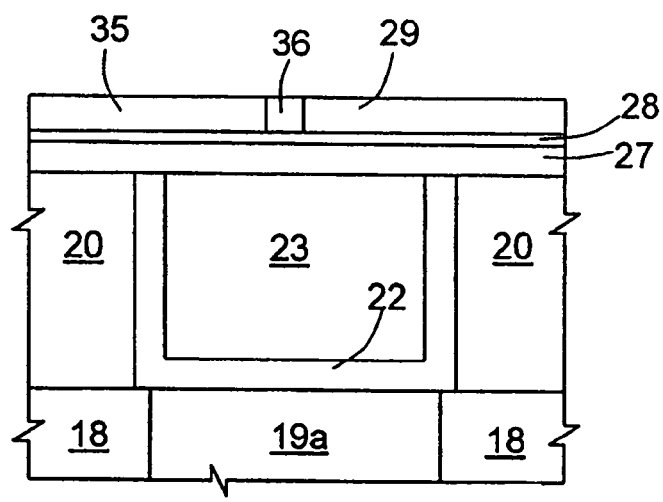

As shown in FIG. 11, a second delimiting layer 35, of the same material as the first delimiting layer 29, for example nitride, with a thickness of 300 nm, is deposited. Next, the delimiting layers 29, 35 and the vertical wall 31a are thinned by chemical mechanical polishing (CMP). At the end, the remaining portions of the delimiting layers 29, 35 form a hard mask, and the remaining portion of the vertical wall forms a sacrificial region 36.

Figure 12:
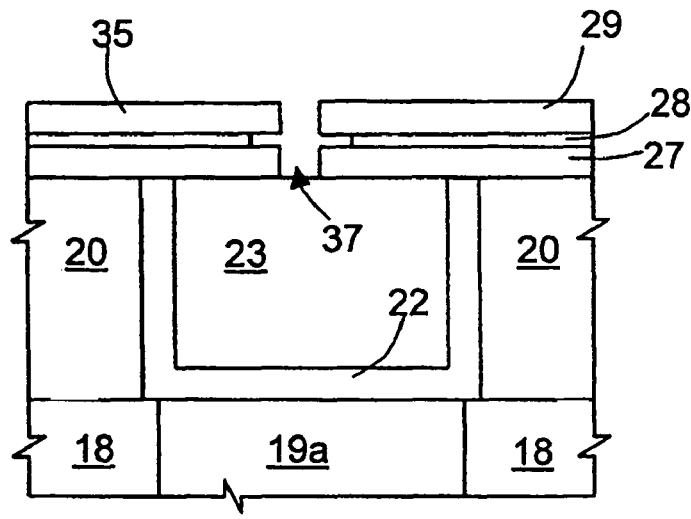

Next (FIG. 12), the sacrificial region 36 is removed. The adhesion layer 28 is isotropically etched, and the mold layer 27 is dry etched to form a slit 37 in the mold layer 27, the slit 37 having a width W1 equal to the width of the sacrificial region 36.

Figure 13:
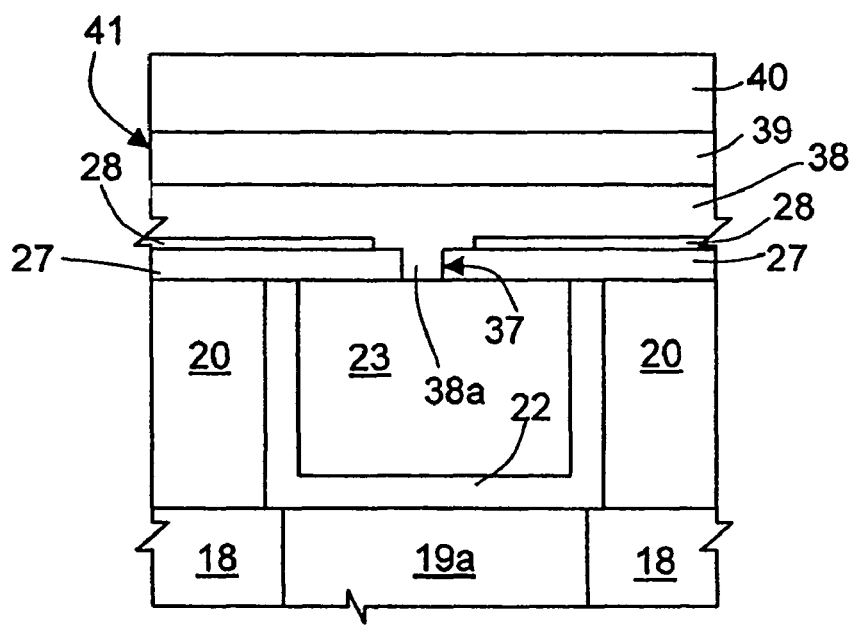

Next (FIG. 13), the delimiting layers 29, 35 are removed, and a chalcogenic layer 38, for example of Ge$_2$Sb$_2$Te$_5$ with a thickness of 60 nm, is deposited conformally. The portion 38a of the chalcogenic layer 38 fills the slit 37 and forms, at the intersection with the cup-shaped region 22, a phase change region similar to the phase change portion 4 of FIG. 3. Then, on top of the chalcogenic layer 38 a barrier layer 39, for example of Ti/TiN, and a metal layer 40, for example of AlCu, are deposited. The structure of FIG. 13 is thus obtained.

Next (FIG. 14), the stack formed by the metal layer 40, barrier layer 39, chalcogenic layer 38, and adhesion layer 28 is defined using a same mask to form a bit line 41. Finally, a third dielectric layer 42 is deposited, which is opened above the base contacts 19b. The openings thus formed are filled with tungsten to form top contacts 43 in order to prolong upwards the base contacts 19b. Then standard steps are performed for forming the connection lines for connection to the base contacts 19b and to the bits lines 41, and the final structure of FIG. 14 is thus obtained.

In practice, as shown in FIG. 15, the intersection between the cup-shaped region 22 and the thin portion 38a of the chalcogenic layer 38 forms a contact area 45 which is approximately square and has sublithographic dimensions. This is due to the fact that both the cup-shaped region 22 and the thin portion 38a have a width equal to the thickness of a deposited layer. In fact, the width of the cup-shaped region 22 is given by the thickness of the heating layer, and the width of the thin portions 38a is determined by the thickness of the sacrificial layer 31 along the vertical side 30. In greater detail, in the proximity of the contact area 45, the cup-shaped region 22 has a sublithographic dimension in a first direction (Y direction), and the thin portion 38a has a sublithographic dimension (width W1 of FIG. 10) in a second direction (X direction) which is transverse to the first direction. Hereinafter, the term "sublithographic dimension" means a linear dimension smaller than the limit dimension achievable with current optical (UV) lithographic techniques, and hence smaller than 100 nm, preferably 50-60 nm, down to approximately 20 nm.

In the process described above, forming the thin portion 38a of the chalcogenic layer 38 entails numerous steps and is somewhat complex. Consequently, it is desirable to avail a simpler alternative process.

In addition, the dimensions of the contact area 45 depend upon the alignment tolerances between the mask used for forming the openings 21 and the mask used for removing part of the first delimiting layer 29 and for forming the vertical side 30 (FIG. 8). In fact, as emerges clearly from a comparison between FIGS. 16a and 16b which are top plan views of the contact area 45, in the case of a cup-like region 22 having a circular shape and a diameter of approximately 0.2 µm, an alignment error of even only 0.05 µm between the two masks results in the thin portions 38a no longer crossing the cup-shaped regions 22 perpendicularly, with a consequent considerable increase in the dimensions of the contact area 45 (see FIG. 16b) and hence a considerable increase in the flowing current, the value whereof would be uncontrollable.

Furthermore, the thin portion 38a crosses each cup-shaped region 22 in two points, thus doubling the total contact area between the thin portions 38a and the cup-shaped regions 22, and consequently also increasing the programming current. In the case of a marked misalignment between the two above masks, just one contact area is even obtained which has dimensions far greater than the requirements. The presence of a double contact gives rise to functional problems, given that in this situation it would be impossible to know which of the two contact areas 45 first causes switching of the overlying thin portion 38a (i.e., the phase change portion), nor would it be possible to be certain that both of the thin portions 38a overlying the two contact areas will switch.

In the following description, parts that are the same as those previously described with reference to FIGS. 4-14 are designated by the same reference numbers.

Figure 7:
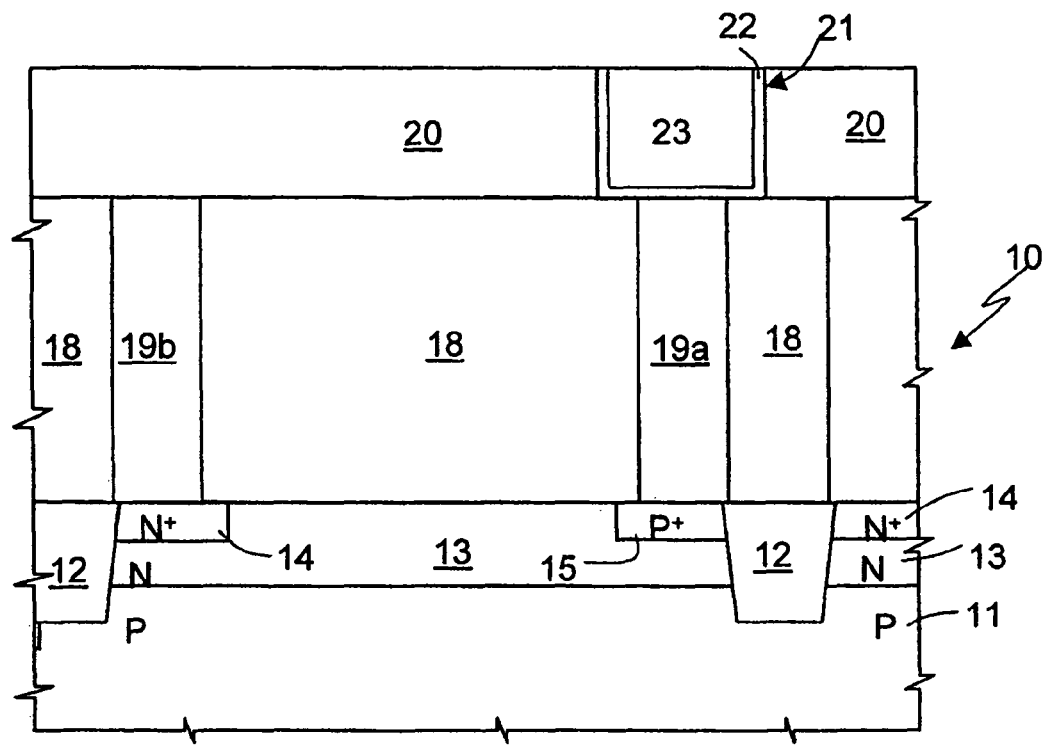
Figure 17:
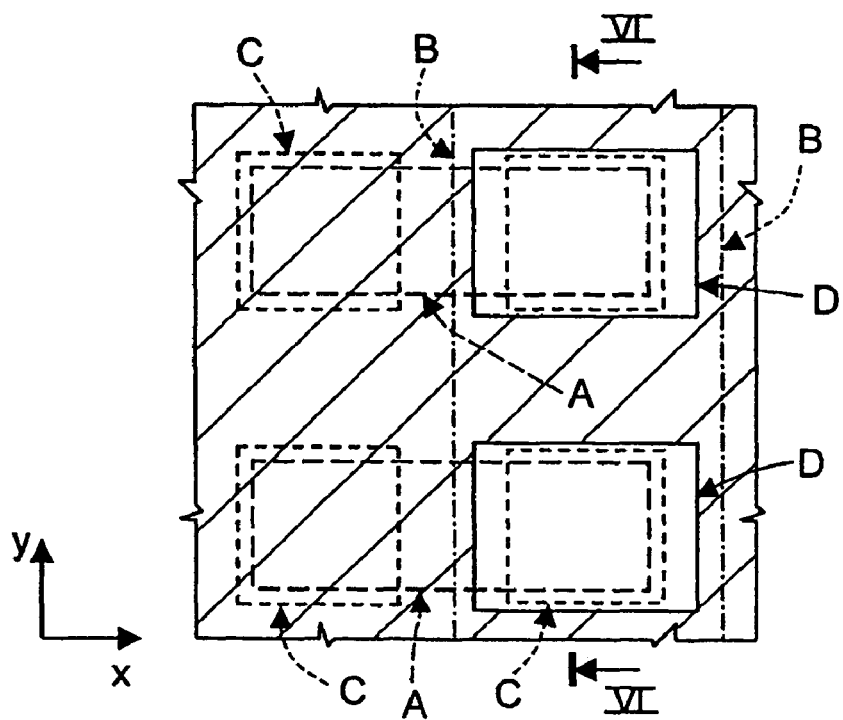
FIG. 17 shows the layout of some masks used for forming the structure of FIG. 7, according to an embodiment of the invention.
Figure 22:
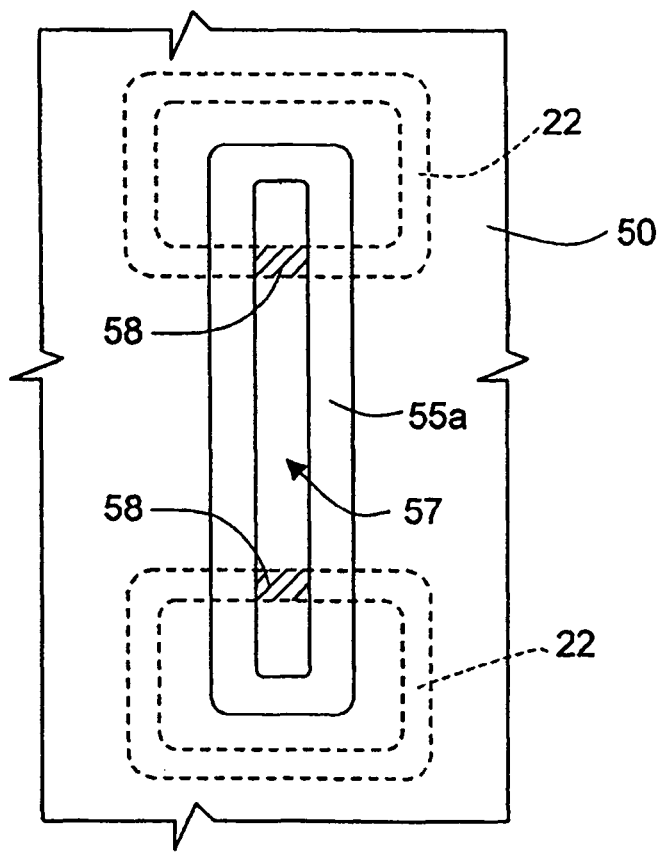
FIG. 22 is a top plan view of the structure of FIG. 21.

The process according to an embodiment of the present invention comprises initial steps equal to those described above, up to deposition of the second dielectric layer 20 (FIG. 7). Next, also here the openings 21 and the cup-shaped regions 22 are formed. However, as shown in FIG. 17, for the definition of the openings 21, a heater mask D is used which has rectangular windows (the term "rectangular" also comprising the particular case of a square shape). Consequently, the openings 21 have a substantially rectangular shape. Then the heating layer, for example of TiSiN, TiAlN or TiSiC, with a thickness of 10-50 nm, preferably 20 nm, is deposited. The heating layer coats the walls and bottom of the openings 21 conformally. Consequently, in top plan view, the cup-like regions 22 here define an ideally rectangular shape, possibly with rounded edges (on account of the lithographic limits), or at the most an ovalized shape, with the longer side, or main direction, parallel to the X direction (FIG. 22). Next, the heating layer is removed outside the openings 21 to form the cup-shaped regions 22, which are then filled with the dielectric material 23.

Figure 18:
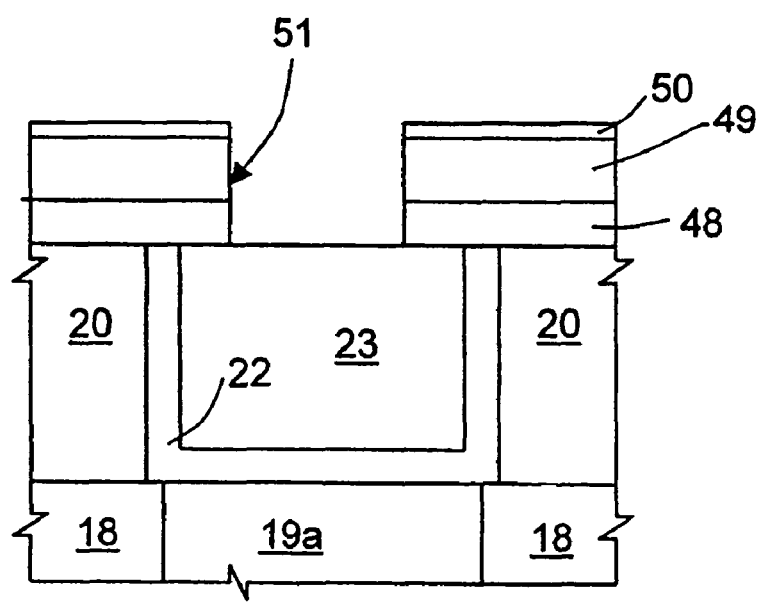
FIG. 18 is a cross-section similar to FIG. 8, in a manufacture step according to an embodiment of the invention.

Then (FIG. 18), a stop layer 48, for example of nitride deposited by PECVD (Plasma Enhanced Chemical Vapor Deposition) with a thickness of 40 nm, a mold layer 49, for example of USG deposited by PECVD or SACVD (Sub-Atmospheric Chemical Vapor Deposition) with a thickness of 50-70 nm, and an adhesion layer 50, for example of Ti or Si with a thickness of 20-40 nm, are deposited in sequence.

Figure 19:
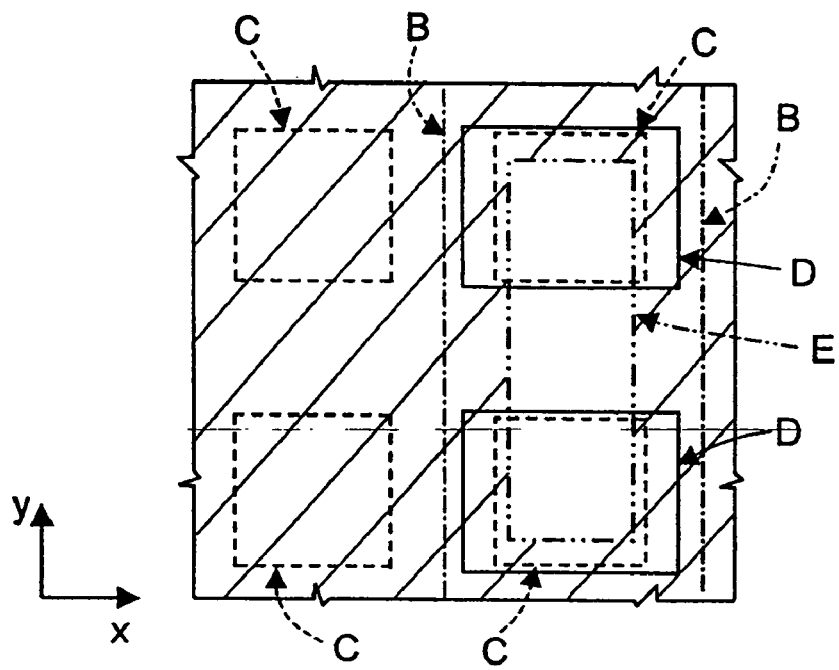
FIG. 19 shows the layout of some masks used for forming the structure of FIG. 18.

Next, using a minitrench mask, designated by E in FIG. 19, the adhesion layer 50, the mold layer 49 and the stop layer 48 are etched. As shown in FIG. 19, the minitrench mask E has a rectangular window that extends between two adjacent cells 5 in the Y direction (perpendicular to the alignment direction of the base and emitter regions 14, 15 of each memory cell 5, FIG. 7).

Following upon etching, part of the layers 48, 49 and 50 is removed, so as to form an opening 51 having a rectangular shape, corresponding to that of the minitrench mask E. The width of the opening 51 in the X direction is, for example, 160 nm. The opening 51 uncovers part of the dielectric material 23 of the two adjacent cells 5 and crosses each cup-shaped region 22 only once, as can be clearly seen from the superposition of the heater mask D and minitrench mask E in FIG. 19.

Figure 20:
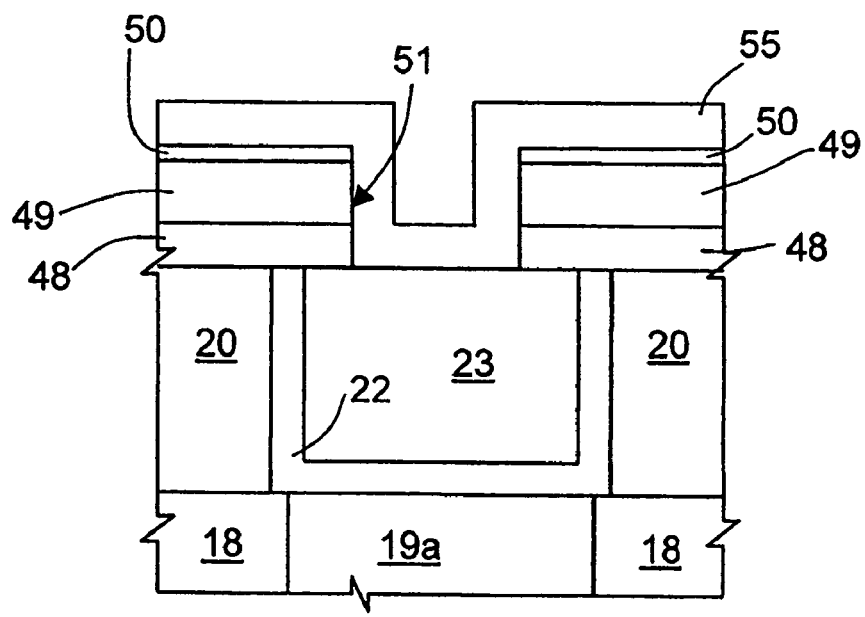
FIGS. 20 and 21 are cross-sections, similar to FIG. 18, in successive manufacture steps according to an embodiment of the invention.

Next, FIG. 20, a spacer layer 55, for example an oxide layer, is deposited (in particular, TEOS with a thickness of 50 nm) is deposited. The spacer layer 55 covers the adhesion layer 50, as well as the walls and bottom of the opening 51.

Figure 21:
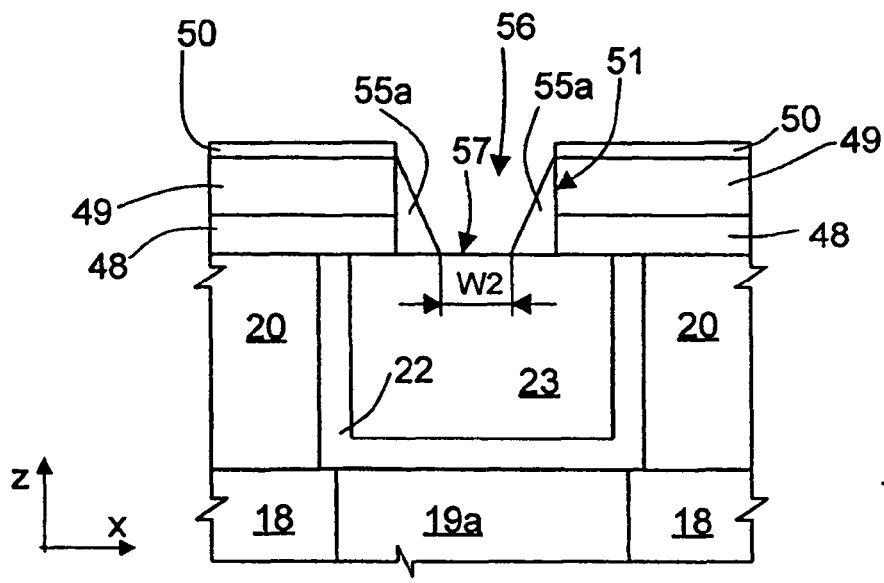

Then, FIG. 21, the spacer layer 55 is anisotropically etched by etching back until the horizontal portions thereof are removed, according to the well known spacer formation technique. The spacer layer 55 is then completely removed above the adhesion layer 50 and is partially removed from the bottom of the opening 51 to form a spacer region 55a which extends along the vertical sides of the opening 51 (along the perimeter of a rectangle or of an oval) and delimits a slit 56, the base whereof forms a rectangular strip 57 having a sublithographic width W2 (in the X direction) of approximately 60 nm. FIG. 22 is a top plan view of the structure thus obtained, and highlights how the strip 57 uncovers only one portion of the cup-shaped region 22 of each cell 5, shown with dashed line in the figure. The uncovered portion of each cup-shaped region 22 forms a contact area 58, as will be explained hereinafter.

Figure 23:
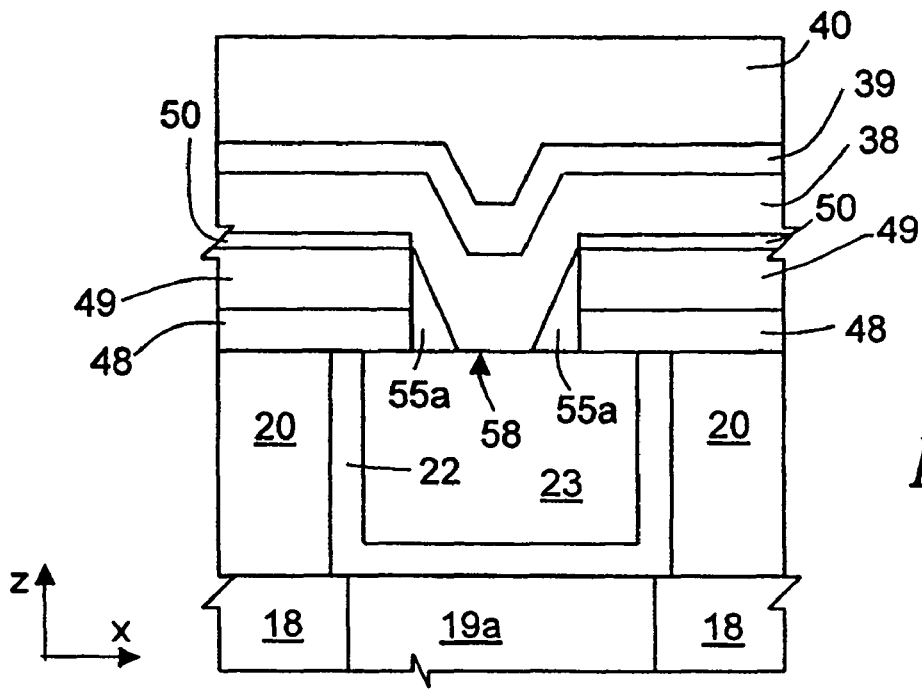
FIG. 23 is a cross-section, similar to FIG. 21, in a subsequent manufacture step.

Next, FIG. 23, the chalcogenic layer 38 (also in the present case, of instance, of $Ge_2Sb_2Te_5$ with a thickness of 60 nm), the barrier layer 39, and the metal layer 40 are deposited in succession, to form a stack of layers 41. The chalcogenic layer 38 is in direct contact with the adhesion layer 50, to which it adheres properly, and fills the slit 56 with a thin portion 38a. In particular, the thin portion 38a of the chalcogenic layer 38 deposits on the strip 57, contacting the cup-shaped regions 22 at the contact areas 58. The inclined wall formed by the spacer region 55a favors filling of the slit 56, so preventing problems linked to a poor aspect ratio of the opening 51.

Figure 24:
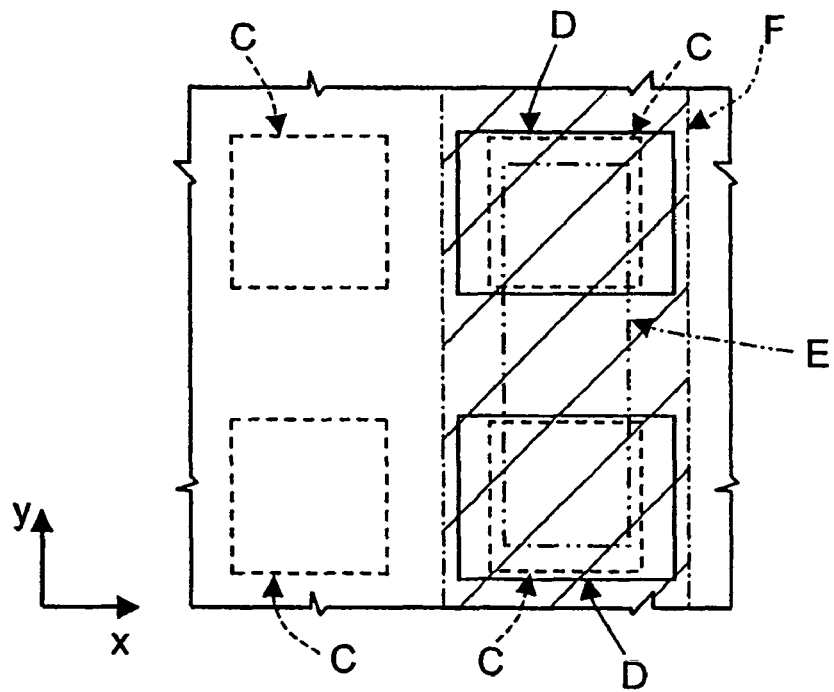
FIG. 24 shows the layout of same masks used for forming the structure of FIG. 23.

Next, the stack of layers 41 is defined using a stack mask F (FIG. 24).

The process continues with the steps described previously, which comprise deposition of the third dielectric layer 42, opening of the third dielectric layer 42 above the base contacts 19b, formation of the top contacts 43, and formation of connection lines for connection to the base contacts 19b and to the bit lines 41, so as to obtain the final structure shown in FIG. 25.

The advantages of the process and structure described herein are illustrated hereinafter. First, the sequence of steps required for forming the thin portion 38a is simplified, and the chalcogenic layer 38 adheres perfectly to the underlying layers and fills the opening 51 correctly, thanks to the inclination of the spacer region 55a, as already mentioned previously.

Furthermore, the shape of the minitrench mask E makes it possible to obtain a single contact area 58 for each cup-shaped region 22, and hence for each cell 5, without requiring any additional masking steps.

The rectangular or ovalized shape of the cup-shaped region 22 reduces the spread in the dimensions of the contact area 58 also when its shape, instead of being rectangular as in the ideal case, is oval, as may be seen from a comparison between FIG. 26a, which shows the position of the cup-shaped region 22 with respect to thin region 38a in the absence of mask misalignment, and FIG. 26b, which shows the relative position in presence of misalignment.

Finally, it is clear that numerous modifications and variations may be made to the process and to the memory cell described and illustrated herein, all falling within the scope of the invention, as defined in the attached claims. For example, the sequence of steps required for forming the spacer region 55a and of the strip 57 may vary. In particular, for forming the opening 51 it is possible to etch the adhesion layer 50 and the mold layer 49 alone, without removing the stop layer 48. Next, the spacer region 55a is formed in the way described previously, by depositing a spacer layer and etching it anisotropically. Finally, the stop layer 48 is removed only where it is not covered by the spacer region 55a, and in this way the strip 57 is uncovered.

Figure 27:
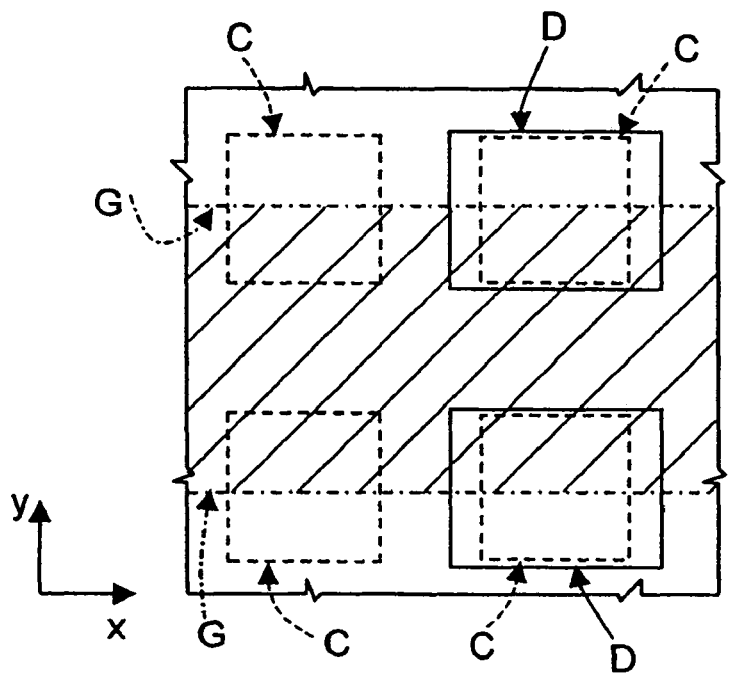
FIGS. 27 and 28 show two steps regarding a different embodiment.
Figure 28:
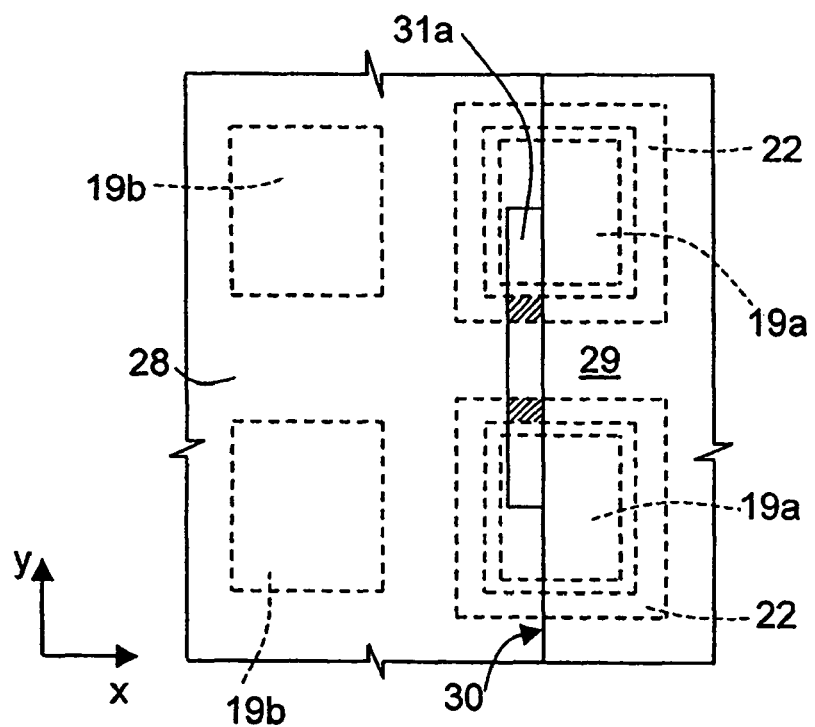

In addition, according to a different embodiment, after forming the opening 51 (FIG. 18) and before depositing the spacer layer 55, a protective layer 54, of silicon nitride, may be deposited, as shown in FIG. 27. The protective layer 54, preferably deposited by PECVD, has, for instance, a thickness of between 20 and 30 nm. Next, etching back is performed to remove the horizontal portions of the spacer layer 55 and then the horizontal portions of the protective layer 54. A protective portion 54a thus is left only beneath the spacer region 55a, as shown in FIG. 28. The protective layer 54 protects the adhesion layer 50 and prevents contamination thereof by the spacer layer 55, which is of oxide, both at the top and at the sides. In addition, it functions as an etch stop and prevents undesired etching of the dielectric layer 20 and of the dielectric material 23 during etching back for forming the spacer region 55a.

According to a further embodiment, after depositing the adhesion layer 50 and before etching using the minitrench mask E, a further nitride layer having a thickness of 20-30 nm is deposited. Then, using the minitrench mask E, the further nitride layer, the adhesion layer 50, and the mold layer 49 are selectively removed, without the stop layer 48 being removed. The spacer layer 55 is deposited, and an etch back is performed for forming the spacer region 55a. Next, a nitride etch is carried out, removing the horizontal portions of the further nitride layer above the adhesion layer 55, and the exposed portion of the stop layer 48. Then the other steps of depositing the chalcogenic layer 38, and so forth, follow. In this way, the further nitride layer protects the adhesion layer 50 from any possible contamination by the spacer layer 55.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A process for forming first and second memory cells adjacent in a first direction, comprising the steps of:
   forming first and second resistive elements of the first and second memory cells, respectively, each of the first and second resistive elements including a first thin portion having a first sublithographic dimension in a first direction; and
   forming a common memory region of a phase change material and including a second thin portion in direct electrical contact with said first thin portions and having a second sublithographic dimension in a second direction transverse to said first direction;
   each resistive element forming, with said second thin portion, a respective contact area of sublithographic extension;
   wherein said step of forming a common memory region comprises forming a mold layer on top of said resistive elements; forming a first lithographic opening in said mold layer, said lithographic opening extending between said pairs of resistive elements above said first thin portion of said pair of resistive elements; forming spacer portions in said lithographic opening, said spacer portions defining a slit having said second sublithographic dimension; and depositing a phase change layer inside said slit.

2. The process according to claim 1 wherein said spacer portions are of a first dielectric material and have surfaces inclined in a third direction transverse to said first and second directions, and said mold layer is of a second dielectric material.

3. The process according to claim 2 wherein, before said step of forming a mold layer, a stop layer of a third dielectric material is formed on top of said resistive element.

4. The process according to claim 3 wherein said spacer portions are of silicon dioxide, said mold layer is of a silicon glass, and said stop layer is of silicon nitride.

5. The process according to claim 1 wherein said step of forming a resistive element comprises forming a second lithographic opening in an insulating layer, depositing a conductive layer on a side wall of said second lithographic opening, and filling said second lithographic opening.

6. The process according to claim 1 wherein said second thin portion has a substantially elongated shape and extends parallel to said first direction.

7. The process according to claim 1 wherein said resistive element has a cup-like shape and has a vertical side that extends, in top plan view, according to a closed line chosen between a rectangular line and an elongated oval line.

8. The process according to claim 1 wherein said step of forming spacer portions comprises, after said step of forming a first lithographic opening, the steps of depositing a spacer layer and anisotropically etching said spacer layer.

9. The process according to claim 1 wherein, before said step of forming a first lithographic opening, the step of depositing an adhesion layer is carried out.

10. The process according to claim 9 wherein said step of forming spacer portions comprises depositing a protective layer, depositing a spacer layer, anisotropically etching said spacer layer, and selectively removing said protection layer above said adhesion layer and at sides of said spacer portions in said first lithographic opening.

11. A process of forming first and second memory cells, comprising:

forming first and second heating elements of the first and second memory cells, respectively, the first and second heating elements having first and second thin portions, respectively; and forming a common memory region of a phase change material and including a third thin portion in direct electrical contact with the first and second thin portions, the third thin portion forming first and second contact areas with the first and second thin portions of the heating elements, respectively, wherein forming the common memory region includes:

forming a mold layer on the heating elements, the mold layer having a first opening positioned between the heating elements;

forming spacer portions in the first opening, the spacer portions defining a slit; and forming the third thin portion of the phase change material inside of the slit.

12. The process of claim 11 wherein the spacer portions are of a first dielectric material and have respective inclined surfaces that extend from sides of the first opening to a bottom of the first opening, and the mold layer is of a second dielectric material.

13. The process of claim 12, further comprising forming a stop layer of a third dielectric material between the heating elements and the mold layer.

14. The process of claim 11 wherein the third thin portion has a substantially elongated shape and extends parallel to the first direction.

\* \* \* \* \*

UNITED STATES PATENT AND TRADEMARK OFFICE
CERTIFICATE OF CORRECTION

PATENT NO. : 7,993,957 B2  
APPLICATION NO. : 11/045170  
DATED : August 9, 2011  
INVENTOR(S) : Roberto Bez et al.

It is certified that error appears in the above-identified patent and that said Letters Patent is hereby corrected as shown below:

On the Title page, in Item (73), in "Assignee", in column 1, line 2, after "(US)" insert
-- Ovonyx Inc., Boise, ID (US) --, therefor.

Signed and Sealed this
Twenty-ninth Day of October, 2013

Teresa Stanek Rea
*Deputy Director of the United States Patent and Trademark Office*